United States Patent
Shahin et al.

(10) Patent No.: US 12,132,296 B2
(45) Date of Patent: Oct. 29, 2024

(54) LASER HAVING REDUCED COHERENCE VIA A PHASER SHIFTER

(71) Applicant: Microsoft Technology Licensing, LLC, Redmond, WA (US)

(72) Inventors: Shiva Shahin, Seattle, WA (US); Dale Eugene Zimmerman, Redmond, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 602 days.

(21) Appl. No.: 17/321,074

(22) Filed: May 14, 2021

(65) Prior Publication Data

US 2022/0368105 A1    Nov. 17, 2022

(51) Int. Cl.
| | | |
|---|---|---|
| *H01S 5/0625* | (2006.01) | |
| *G02B 27/01* | (2006.01) | |
| *G02B 27/48* | (2006.01) | |
| *H01S 5/026* | (2006.01) | |
| *H01S 5/06* | (2006.01) | |
| *H01S 5/065* | (2006.01) | |
| *H01S 5/40* | (2006.01) | |

(52) U.S. Cl.
CPC ........ *H01S 5/0625* (2013.01); *G02B 27/0172* (2013.01); *G02B 27/48* (2013.01); *H01S 5/026* (2013.01); *H01S 5/0652* (2013.01); *G02B 2027/0178* (2013.01); *H01S 5/0614* (2013.01); *H01S 5/4012* (2013.01); *H01S 5/4093* (2013.01)

(58) Field of Classification Search
CPC ..... H01S 5/0625–06258; H01S 5/0652; H01S 5/06246; H01S 5/026–0268
See application file for complete search history.

(56) References Cited

U.S. PATENT DOCUMENTS 4,862,471 A * 8/1989 Pankove ............... B82Y 20/00
257/191
5,521,738 A * 5/1996 Froberg ............... G02F 1/0121
398/183
(Continued)

FOREIGN PATENT DOCUMENTS

CN 105717661 A * 6/2016 ......... G02B 27/4205
CN 109638641 A * 4/2019 ........... H01S 5/0427
(Continued)

OTHER PUBLICATIONS

Willis et al., "Modulation-Induced Coherence Collapse in FM External-Cavity Diode Lasers," Oct. 1993, OSA Annual Meeting Technical Digest, 3. (Year: 1993).*
(Continued)

*Primary Examiner* — Joshua King
(74) *Attorney, Agent, or Firm* — Alleman Hall & Tuttle LLP

(57) ABSTRACT

A laser device includes a laser and a controller. The laser has an optical cavity that includes an active gain section and a phase shifter. The controller is configured to excite the active gain section to lase light out of the optical cavity. The controller is further configured to, while the light is being lased out of the optical cavity, modulate a refractive index of the phase shifter to shift an optical phase of lasing modes of the lased light to thereby reduce coherence of the lased light.

18 Claims, 10 Drawing Sheets

(56) References Cited

U.S. PATENT DOCUMENTS

| | | | | |
|---|---|---|---|---|
| 5,991,061 A | * | 11/1999 | Adams | H01S 5/06258 385/14 |
| 8,559,470 B2 | * | 10/2013 | Dallesasse | H01S 5/141 372/20 |
| 10,923,884 B2 | | 2/2021 | Shahin et al. | |
| 2002/0043561 A1 | * | 4/2002 | Tsikos | G06K 7/10603 257/E29.144 |
| 2002/0117545 A1 | * | 8/2002 | Tsikos | G02B 27/48 235/454 |
| 2002/0195496 A1 | * | 12/2002 | Tsikos | B82Y 15/00 235/462.01 |
| 2003/0042303 A1 | * | 3/2003 | Tsikos | G06K 7/10594 235/384 |
| 2003/0052169 A1 | * | 3/2003 | Tsikos | G06V 20/62 235/454 |
| 2003/0076566 A1 | * | 4/2003 | Simon | H04B 10/504 398/182 |
| 2005/0008048 A1 | * | 1/2005 | McInerney | B82Y 20/00 372/25 |
| 2007/0165685 A1 | * | 7/2007 | Mizuuchi | H01S 5/0625 372/50.1 |
| 2007/0223857 A1 | * | 9/2007 | Nunoya | G02B 6/4202 385/14 |
| 2007/0237193 A1 | * | 10/2007 | Finzi | H01S 5/0622 372/28 |
| 2008/0175285 A1 | * | 7/2008 | Hu | H01S 5/06256 372/28 |
| 2008/0310465 A1 | * | 12/2008 | Achtenhagen | H01S 5/14 372/22 |
| 2009/0041464 A1 | * | 2/2009 | Ledentsov | H01L 31/02325 398/87 |
| 2009/0080466 A1 | * | 3/2009 | Yamamoto | G11B 7/0065 372/5 |
| 2009/0129414 A1 | * | 5/2009 | Gollier | H04N 9/3158 372/20 |
| 2010/0079848 A1 | * | 4/2010 | Grasser | H04N 9/3129 372/27 |
| 2010/0080253 A1 | * | 4/2010 | Masood | H04N 9/3129 353/31 |
| 2011/0150484 A1 | * | 6/2011 | Wang | H04B 10/25751 398/186 |
| 2011/0317130 A1 | * | 12/2011 | Gollier | H04N 9/3129 353/34 |
| 2012/0044961 A1 | * | 2/2012 | Shen | H01S 5/026 372/18 |
| 2013/0044771 A1 | * | 2/2013 | Minneman | H01S 5/0652 372/20 |
| 2013/0044778 A1 | * | 2/2013 | Gollier | H01S 5/06256 372/92 |
| 2013/0258210 A1 | * | 10/2013 | Kurihara | H04N 9/3161 348/750 |
| 2014/0029015 A1 | * | 1/2014 | Schmoll | G01B 9/02058 356/497 |
| 2014/0270788 A1 | * | 9/2014 | Blauvelt | H01S 5/0427 398/116 |
| 2015/0288137 A1 | * | 10/2015 | Lee | H01S 5/06256 372/28 |
| 2016/0248223 A1 | * | 8/2016 | Blauvelt | H01S 5/0265 |
| 2018/0195905 A1 | * | 7/2018 | Poole | G01J 3/0224 |
| 2019/0294107 A1 | * | 9/2019 | Kondo | G03H 1/0005 |
| 2019/0372306 A1 | * | 12/2019 | Reidy | G02B 6/0016 |
| 2020/0274324 A1 | | 8/2020 | Dykaar | |
| 2021/0021100 A1 | * | 1/2021 | Melikyan | H01S 5/06256 |

FOREIGN PATENT DOCUMENTS

| | | | | |
|---|---|---|---|---|
| CN | 111856864 A | * | 10/2020 | G01B 11/254 |
| DE | 102018204715 A1 | * | 10/2019 | G02F 1/29 |
| EP | 1710876 A1 | | 10/2006 | |
| JP | H08162716 A | * | 6/1996 | |
| JP | H09179079 A | * | 7/1997 | |
| JP | 5622239 B2 | * | 11/2014 | |
| WO | WO-2018100579 A1 | * | 6/2018 | H01S 3/06754 |
| WO | 2020231567 A1 | | 11/2020 | |

OTHER PUBLICATIONS

"International Search Report and Written Opinion Issued in PCT Application No. PCT/US22/024181", Mailed Date: Jul. 13, 2022, 11 Pages.

* cited by examiner

LASER HAVING REDUCED COHERENCE VIA A PHASER SHIFTER

BACKGROUND

Displays using laser scanning micro-electro-mechanical systems (MEMS) have several advantages over liquid crystal displays (LCDs) and liquid crystal on silicon (LCOS) displays. Such advantages include smaller size, lighter weight, lower power consumption, and higher brightness and contrast. In a waveguide-based laser scanning display, image light beams emitted from the laser are coupled into one or more waveguides. These light beams propagate through and replicate in the waveguide, and then are coupled out into a user's eyes.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A laser device includes a laser and a controller. The laser has an optical cavity that includes an active gain section and a phase shifter. The controller is configured to excite the active gain section to lase light out of the optical cavity. The controller is further configured to, while the light is being lased out of the optical cavity, modulate a refractive index of the phase shifter to shift an optical phase of lasing modes of the lased light to thereby reduce coherence of the lased light.

DETAILED DESCRIPTION

In contrast to spontaneous emission light sources, lasers produce light through stimulated emission. Typically, the stimulated emission of lasers creates photons of identical phase, frequency, and direction of travel in a cavity of the laser device, the photons being at a wavelength with gain near a maximum. Thus, the stimulated emission process typically results in a narrower spectral bandwidth of coherent light being emitted by lasers compared to other types of light sources such as LEDs that emit incoherent light.

The narrower spectra in lasers can cause several challenges in display applications. For example, the narrower spectra may potentially cause high contrast fringe artifacts in waveguide-based displays. In a waveguide-based laser scanning display, there are myriad (e.g., millions of) light paths resulting from multiple interactions of image light beams propagating through a waveguide and grating structures (e.g., surface relief grating SRG). As such, there are myriad possible interactions between light beams with different optical path lengths (OPLs). A typical laser is a coherent light source where certain OPLs that are proportional to an optical cavity length of the laser form temporal coherence peaks. If an OPL of the waveguide matches any of the coherence OPLs of the laser, an interference fringe may be formed. An interference fringe may create an artifact in an image presented by the waveguide-based laser scanning display. Such an artifact may degrade the perceived image quality of the waveguide-based laser scanning display.

Figure 1:
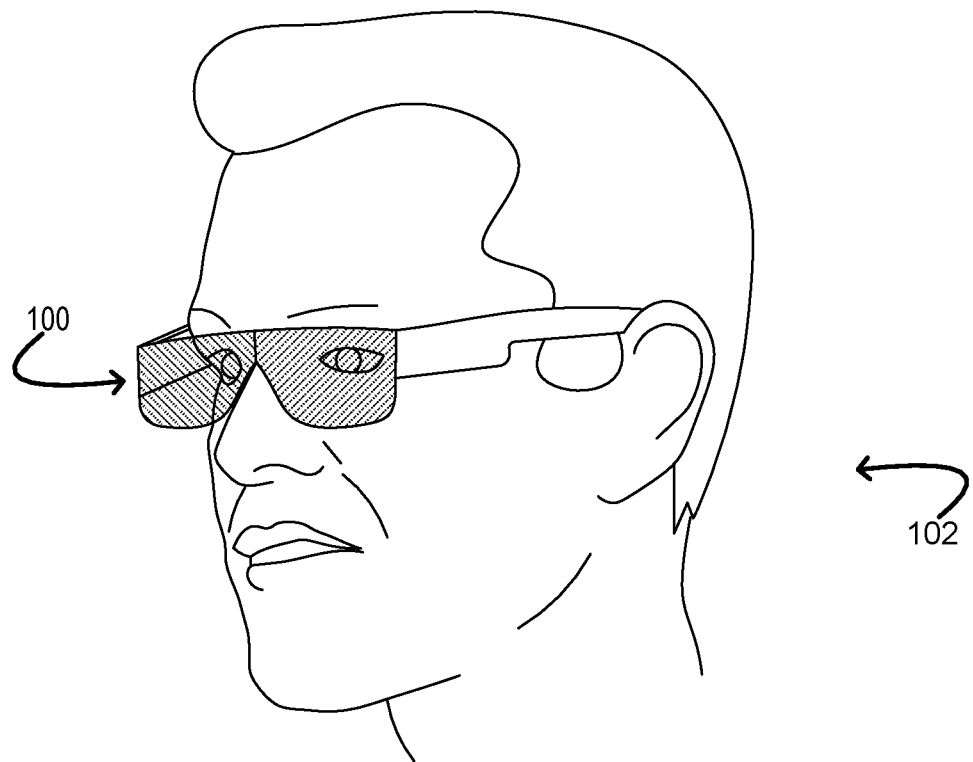
FIG. 1 shows an example near-eye display device.

FIG. 1 illustrates an example near-eye display device 100 that employs, to address the above issues, a laser having an intra-cavity phase shifter. The phase shifter may be chirped to modulate a refractive index of an optical cavity of the laser. As used herein, "chirped" or "chirping" refers to a form of modulation in which frequency or some other characteristic of a control signal (or the outcome produced by the control signal) increases (up-chirp) or decreases (down-chirp) with time. In the present examples, modulation of the refractive index of the laser optical cavity increases an exponential decay rate in a coherence function of light lased out of the optical cavity and into a waveguide of the near-eye display device 100. By suitably increasing the exponential decay rate of the coherence function, overlap between fringes of the waveguide and laser coherence peaks may be reduced and/or avoided. Accordingly, image artifacts due to interference fringes of the near-eye display device 100 can be reduced and/or eliminated to increase quality of displayed images.

As illustrated herein, the near-eye display device is worn and operated by a user 102. The near-eye display device 100 is configured to present virtual imagery in the user's field of view. In some implementations, user-input componentry of the near-eye display device 100 may enable the user to interact with the virtual imagery. The near-eye display device 100 takes the form of eyeglasses in the example of FIG. 1. In other examples, the near-eye display device 100 may take the form of goggles, a helmet, or a visor. In still other examples, the near-eye display device 100 may be a component of a non-wearable electronic device, such as a heads-up display. Indeed, the present discussion is applicable to any laser-based display where fringe-type artifacts are potentially an issue.

The near-eye display device 100 may be configured to cover one or both eyes of the user 102 and may be adapted for monocular or binocular image display. In examples in which the near-eye display device 100 covers only one eye, but binocular image display is desired, a complementary near-eye display device may be arranged over the other eye. In examples in which the near-eye display device covers both eyes and binocular image display is desired, the virtual imagery presented by the near-eye display device 100 may be divided into right and left portions directed to the right and left eyes, respectively. In scenarios in which stereoscopic image display is desired, the virtual imagery from the right and left portions, or complementary near-eye display devices, may be configured with appropriate stereo disparity to present a three-dimensional subject or scene.

Figure 2:
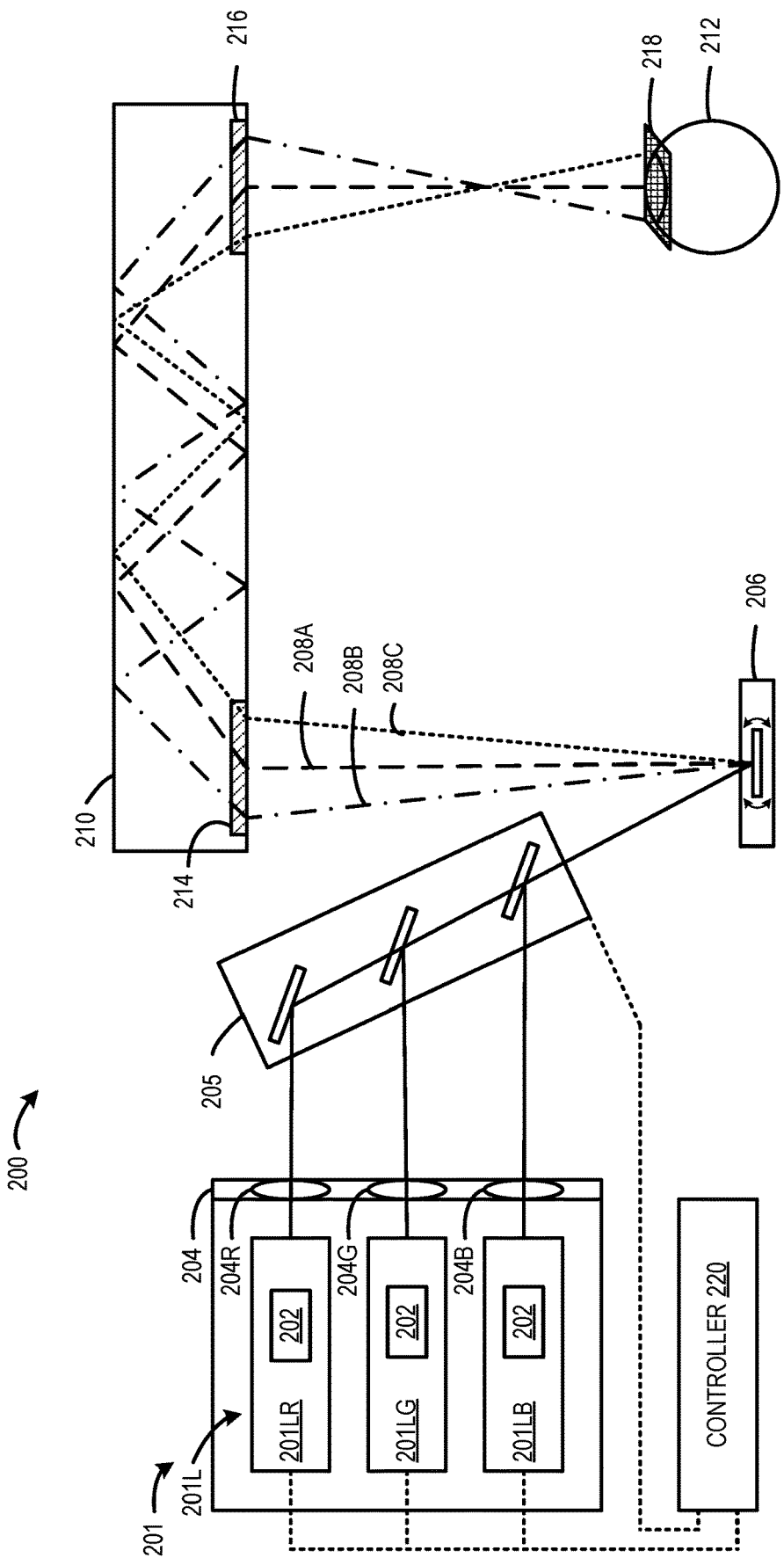
FIG. 2 schematically shows an example micro-electromechanical systems (MEMS) laser scanning display of the near-eye display device of FIG. 1.

FIG. 2 shows an example micro-electro-mechanical system (MEMS) laser scanning display 200 that may be incorporated into the near-eye display device 100 of FIG. 1, or other near-eye display devices. The MEMS laser scanning display 200 uses a laser assembly 201 as a laser light source. The laser assembly 201 comprises a plurality of individual laser light sources 201L which may each emit an associated color of light. The laser light sources 201L may each be comprised of one or more laser diode emitters 202. For example, red laser light source 201LR emits red light, green laser light source 201LG emits green light, and blue laser light source 201LB emits blue light. Although only three laser light sources 201L are shown, it will be appreciated that the laser assembly 201 may include any suitable number of laser light sources 201L. For example, the laser assembly 201 may include 0, 1, 2, 3, or more than 3 red laser light sources 201LR; 0, 1, 2, 3, or more than 3 green laser lights sources 201LG; 0, 1, 2, 3, or more than 3 blue laser light sources 201LB; and 0, 1, 2, 3, or more than 3 laser diode emitters of other colors. Any combination or modification in the number of laser diode emitters may also be available (e.g., 2 red, 2 green, 2 blue, or 1 red, 1 green, 2 blue, etc.). Accordingly, any suitable number of laser light sources may be used to irradiate/illuminate pixels for generating image content. Further, each laser light source may have a suitable number of laser diode emitters 202, which may be singular or arranged in an array for example.

In some, though not all, configurations, the laser assembly 201 also includes a collimating lens assembly 204 (or other diffractive optical element) that is structured to direct light to another location or otherwise operate on the light in some manner. In this example, each of the laser light sources 201LR, 201LG, and 201LB has a corresponding collimating lens 204, individually labeled 204R, 204G, 204B. In some implementations, however, a single collimating lens may be used for more than one laser light source.

The MEMS laser scanning display 200 includes combination optics 205 configured to spatially combine the light beams lased from the plurality of laser light sources 201LR, 201LG, and 201LB into a single light beam.

The MEMS laser scanning display 200 includes a MEMS mirror system 206, though the principles disclosed herein are applicable to any type of laser-based display unit and not only to architectures with the MEMS mirror system 206. The MEMS mirror system 206 is configured to collect laser light from the combination optics 205, which combines light lased from three different sources (i.e., the laser light sources 201LR, 201LG, and 201LB) into a single light beam. Additionally, the MEMS mirror system 206 is configured to direct laser light 208A (which, in this example includes red laser light, green laser light, and blue laser light) to a waveguide 210. Furthermore, the MEMS mirror system 206 is configured to redirect its mirrors/mirror array so that the laser light 208A is aimed at different locations at the waveguide 210. As shown, laser lights 208B and 208C are aimed at different locations on the waveguide 210. In this manner, the MEMS mirror system 206 is able to route light to different locations by adjusting the aim of its corresponding mirror array. It will be appreciated that the laser lights 208A-C may be modulated to include varying degrees or intensities (or even an absence of any one or more) of red, green, blue, or other color, laser light.

The waveguide 210 is configured to redirect or propagate the laser light 208A-C to a desired location which is viewable by a user's eye 212. It will be appreciated that waveguide 210 may be any type of waveguide display (e.g., a surface relief grating waveguide).

The laser light 208A-C enters the waveguide 210 via an entry grating 214. The laser light 208A-C then propagates (e.g., via total internal reflection) through the waveguide 210 until it reaches an exit grating 216. It will be appreciated that the angles with which the laser light 208A-C enters the waveguide 210 are preserved as the laser light 208A-C propagates through the waveguide 210. This condition is shown by the different angles that each of the respective laser lights 208A-C propagate through the waveguide 210. By configuring the entry grating 214 and the exit grating 216 to meet certain design parameters, the MEMS mirror system 206 is able to use waveguide 210 to propagate light towards the user's eye 212.

The laser assembly 201 and the MEMS mirror system 206 may be controlled by a controller 220. The controller 220 may be configured to control the MEMS mirror system 206, in conjunction with the laser assembly 201 to progressively scan a set of pixels 218. In particular, the controller 220 may be configured to adjust the mirror array so that the combined RGB laser beam or light is aimed at different locations for a user's eye 212 to view. Individual pixels of the set of pixels 218 may be scanned in such a rapid manner that the entirety of a resulting image appears before the user's eye 212 without the user realizing that the image was progressively scanned pixel by pixel and line by line. In this way, the MEMS laser scanning display 200 may project or render image content for a user to view.

The MEMS mirror system 206 may be able to scan an image (i.e., pixels of that image) at any image resolution or range of image resolutions (e.g., in cases where foveated rendering is used). For example, in some implementations, the MEMS mirror system 206 is configured to scan RGB light from the laser assembly 201 with a resolution of 2,000 pixels by 1,200 pixels, or any other resolution.

Figure 3:
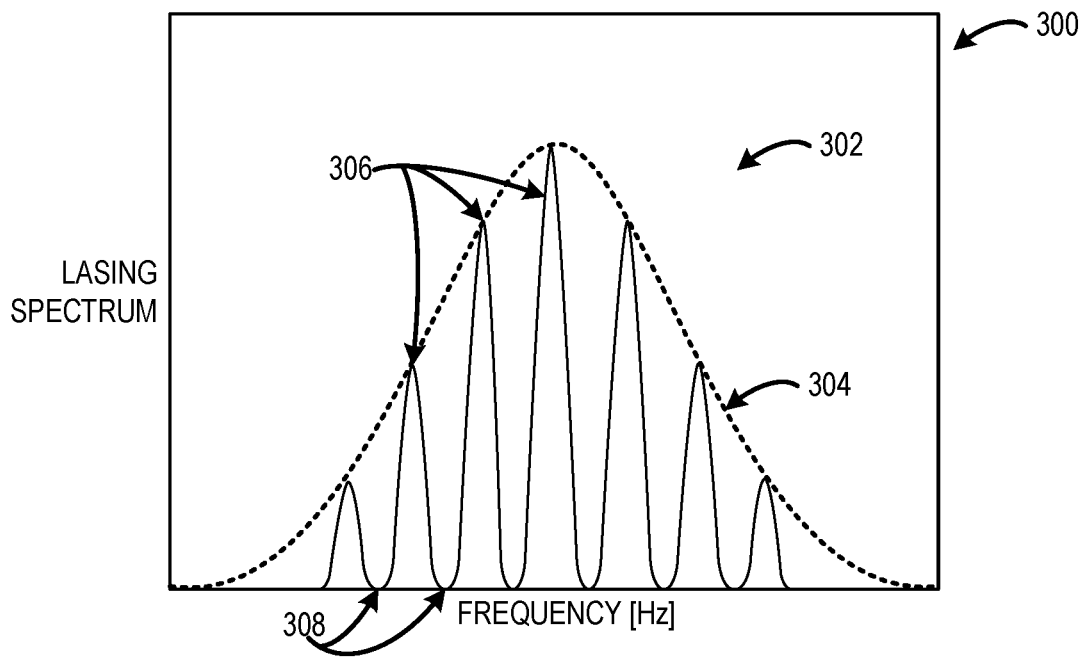
FIG. 3 shows a graph of an example composite waveform of laser light output from a laser diode emitter that emits coherent light.

FIG. 3 shows a graph 300 of an example composite waveform 302 of laser light output from a laser diode emitter that emits coherent light. The graph 300 represents the composite waveform 302 in the frequency domain (e.g., Hz). The laser light is a composite of multiple separate waveforms with different OPLs contained within a bandwidth 304. The composite waveform 302 includes a plurality of peaks 306 (i.e., coherence peaks where OPLs of different light beams have temporal coherence) and valleys 308 as a result of combining each of the multiple waveforms. The distance between the coherence peaks is referred to as one free-spectral range (FSR) defined by the equation:

$$FSR = \frac{c}{2nL}$$

where c is the speed of light, n is the effective refractive index of the optical cavity of the lase diode emitter, and L is the length of the optical cavity of the lase diode emitter.

The shape of the coherence peaks is defined by the laser gain spectrum of the laser diode emitter.

Figure 4:
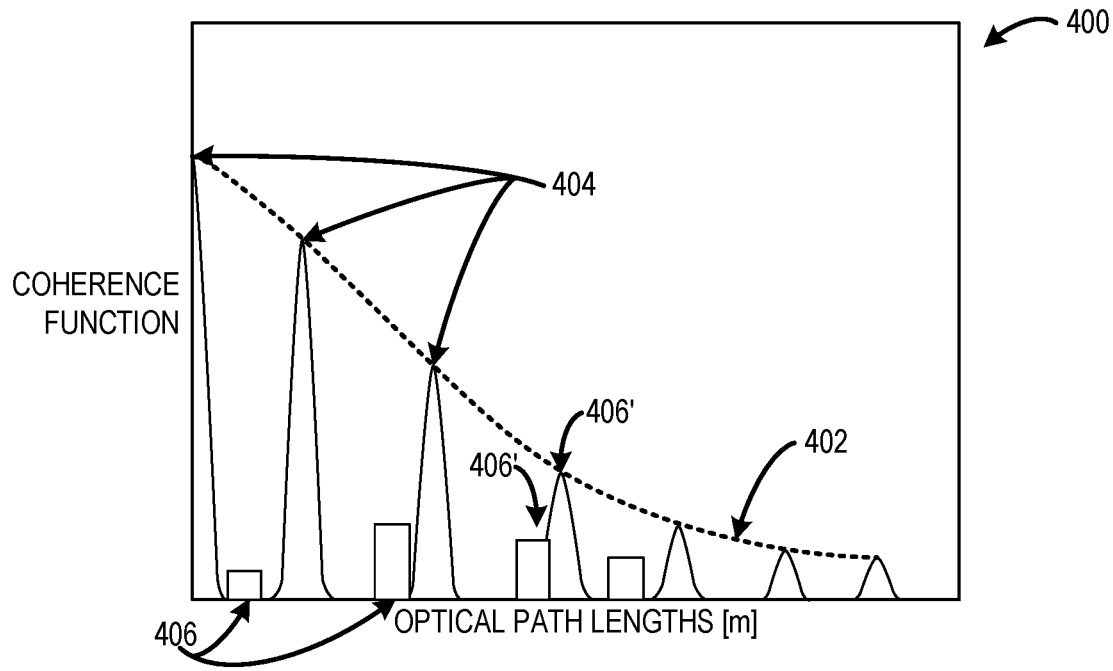
FIG. 4 shows a graph of an example coherence function that is proportional to the Fourier Transform of the composite waveform shown in FIG. 3.

FIG. 4 shows a graph 400 of an example coherence function 402 that is proportional to the Fourier Transform of the composite waveform 302 shown in FIG. 3. The coherence function 402 include a plurality of coherence peaks 404 corresponding to OPLs that define degrees of laser temporal coherence of laser light output from a laser diode emitter. The plurality of coherence peaks 404 are each separated by a coherence gap that is defined by the equation:

Coherence gap=2nL where c is the speed of light, n is the effective refractive index of the optical cavity of the laser diode emitter, and L is the length of the optical cavity of the laser diode emitter.

The graph 400 further includes a plurality of interference fringes 406 of the waveguide. In instances where the interference fringes 406 do not overlap with the coherence peaks 404 of the laser light, the interference fringes do not create artifacts in an image output from the waveguide. However, interference fringes that do overlap with coherence peaks create artifacts in the image output from the waveguide. In the illustrated example, interference fringe 406' overlaps with coherence peak 404' to create an artifact in the image output from the waveguide. For example, such interference fringes may result from input laser light into the waveguide bouncing back and forth a few times and then combining with itself exiting the waveguide. As a result of such interference fringes, various different bright and dark rings/spots are created.

Figure 5:
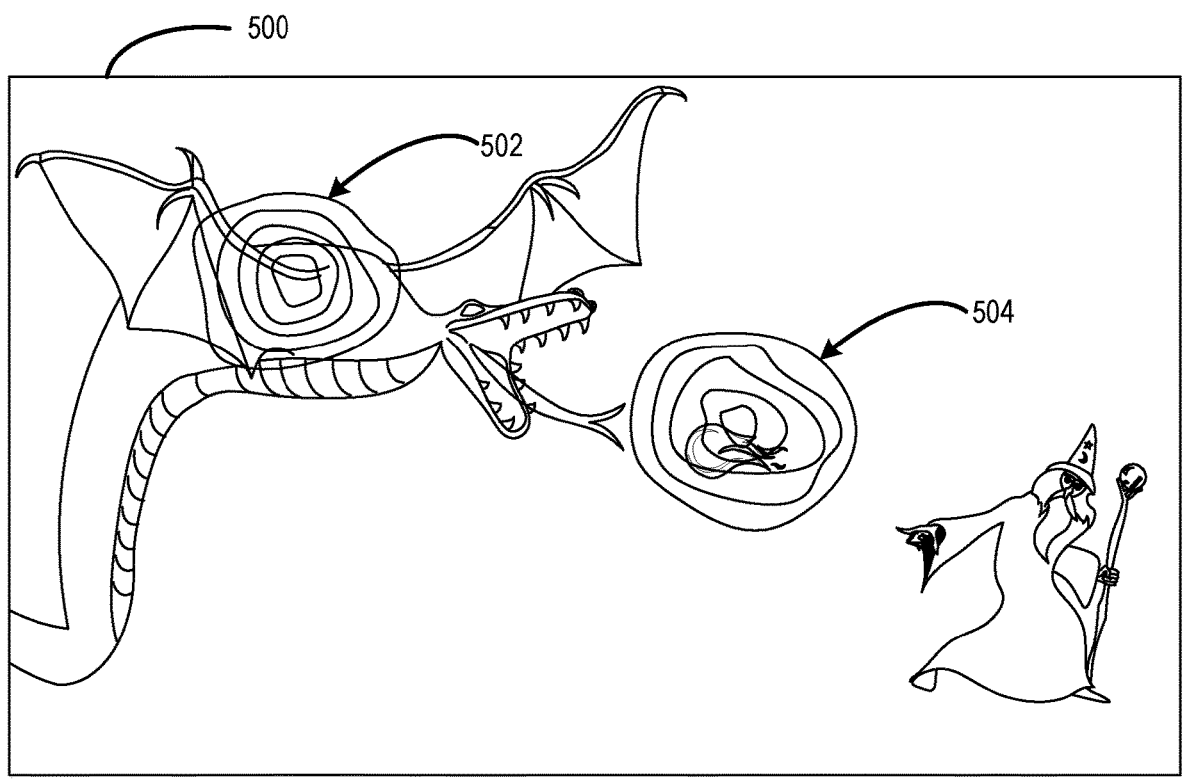
FIG. 5 shows an example image having interference fringe artifacts due to coherence peaks of laser light overlapping with interference fringes of a waveguide.

FIG. 5 shows an example image 500 including artifacts 502 and 504 caused by such interference fringes. The artifacts 502, 504 include irregularities in terms of brightness. The presence of such artifacts in an image can lower the perceived quality of the image and thereby negatively affect the user experience. In the depicted example, the artifact 502 distorts the appearance of a dragon in image 500. Further, the artifact 504 distorts the appearance of a fireball shot by a wizard at the dragon in the image 500.

To reduce image artifacts due to interference fringes in the waveguide 210 of the MEMS laser scanning display 200 shown in FIG. 2, the laser diode emitters 202 may be configured to emit laser light into the waveguide 210 having a coherence function with an exponential decay rate that is suitably high enough to mitigate interference due to overlap between lasing modes of the laser coherence function and the waveguide-defined fringes.

Figure 6:
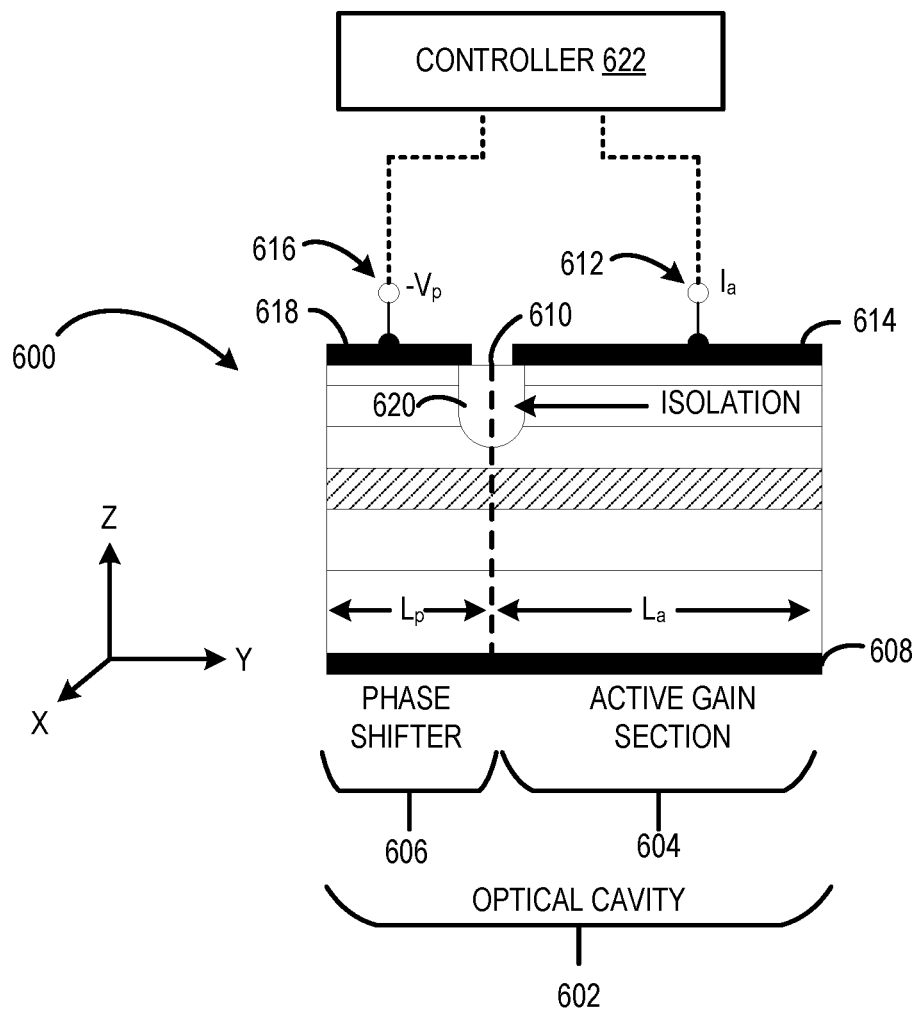
FIG. 6 shows an example implementation of a laser including an intra-cavity phase shifter.

FIG. 6 shows an example implementation of a laser 600 including an intra-cavity phase shifter. The phase shifter is configured to change a refractive index of an optical cavity of the laser 600 resulting in an increase of an exponential decay rate in a coherence function of light lased out of the optical cavity of the laser 600. In one example, the laser 600 comprises a Gallium Nitride Fabry Perot laser diode. However, the laser 600 may be representative of any suitable type of laser. For example, the laser 600 may be representative of any of the laser diode emitters 202 of any of the laser light sources including 201LR, 201LG, and 201LB in the MEMS laser scanning display 200 shown in FIG. 2 or any other suitable laser device that includes a waveguide-based display.

FIG. 6 illustrates a schematic view of a vertical cross-section along a Y-Z plane of the laser 600. The laser 600 includes an optical cavity 602. The optical cavity includes a gain section 604 and a phase-shifter 606. The gain section has a length $L_a$ and the phase shifter has a length $L_p$ that collectively makeup the length of the optical cavity. As discussed above, the length of the optical cavity factors into the spacing between peaks of a coherence function of light lased out of the optical cavity. The laser 600 includes a substrate 608 that extends across the X-Y plane. The various layers of the laser 600 may be directly or indirectly deposited on top of the substrate 608. The gain section 604 and the phase shifter 606 are sections of the optical cavity 602 that extend vertically along the Z-axis from the substrate 608. A dividing line 610 is shown to schematically illustrate a boundary between the gain section 604 and the phase shifter 606. However, various layers of the laser 600 may extend through both the gain section 604 and the phase shifter 606.

The active gain section 604 is the source of optical gain within the laser 600. The active gain section 604 is configured to amplify an optical power of light reflecting within the optical cavity 602. The gain/amplification results from the stimulated emission of electronic or molecular transitions of an active gain medium of the active gain section 604 to a lower energy state from a higher energy state previously populated by a pump source. To this end, the gain section 604 is coupled with a current source 612 via a first electrode 614. In other examples, the gain section 604 may be coupled to a voltage source instead of a current source.

The phase shifter 606 is configured to have a refractive index that can be modulated to thereby change a refractive index of the optical cavity 602. The phase shifter 606 is coupled with a voltage source 616 via a second electrode 618. In other examples, the second electrode 618 may be coupled to a current source instead of a voltage source.

At least a portion of the gain section 604 may be electrically isolated from at least a portion of the phase shifter 606. For example, the first electrode 614 may be separated from the second electrode 618, such that drive currents supplied by the current source 612 and the voltage source 616 may be injected into the respective portions of the gain section 604 and phase shifter 606 that lie underneath the first and second electrodes 614, 618, respectively.

Further, in some examples, the gain section 604 and the phase shifter 606 may be further electrically isolated from each other via a notch 620 that extends downward in between the first and second electrodes 614, 618 into the top layers of the optical cavity 602. In the illustrated example, the notch 618 electrically isolates the first and second electrodes 614, 618, as well as the top few layers of the optical cavity 602.

A controller 622 may be electrically connected to the first electrode 614 and the second electrode 618. In some examples, the controller 622 may be representative of the controller 220 shown in FIG. 2. In other examples, the controller 622 may be a separate controller that is designated to individually control the laser 600. The controller 622 may include or act as a current source and/or a voltage source to provide drive currents/voltages to the first and second electrodes 614, 618. The controller 622 may be configured to excite the active gain section 604 to lase light out of the optical cavity 602 by providing a drive current and/or voltage to the first electrode 614. Further, the controller 622 may be configured to, while the light is being lased out of the optical cavity 602, modulate a refractive index of the phase shifter 606 by providing a drive current and/or voltage to the second electrode 618.

In the illustrated implementation, the controller 622 is configured to modulate the refractive index of the phase shifter 606 by applying a driving current/voltage to the phase shifter 606. The controller may be configured to modulate the refractive index of the phase shifter 606 in any suitable manner. In some implementations, the controller 622 may be configured to modulate the refractive index of the phase shifter 606 by applying an electrostatic field to the phase shifter 606. In some implementations, the controller 622 may be configured to modulate the refractive index of the phase shifter 606 by injecting carriers into the phase shifter 606. In some implementations, the controller 622 may be configured to modulate the refractive index of the phase shifter 606 by varying a temperature of the phase shifter 606.

In one example, the controller 622 may modulate the refractive index of the phase shifter 606 based on the equation:

$$\frac{\Delta\lambda}{\lambda} = \frac{\Delta n}{n}$$

where $\lambda$ is the lasing wavelength and n is the effective refractive index of the optical cavity 602. This equation indicates that as the effective refractive index n changes the optical phase of the lasing modes i.e., the lasing wavelength of the coherence peaks shifts.

Figure 7:
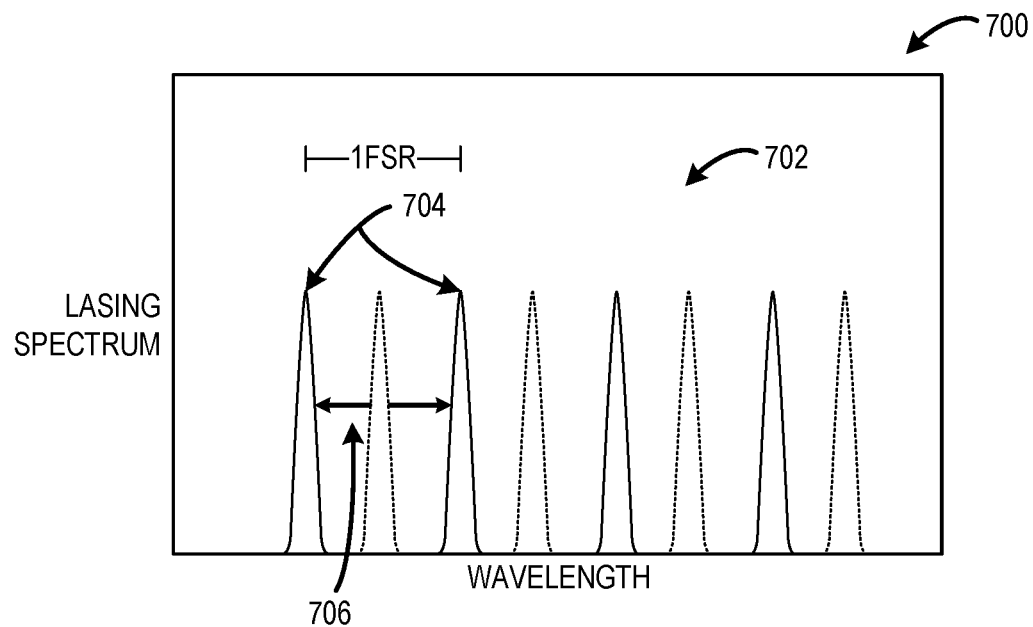
FIG. 7 shows a graph of an example waveform of laser light output from a laser including coherence peaks that may be shifted via modulation of a refractive index of a phase shifter of the laser.

FIG. 7 shows a graph 700 of an example waveform 702 of laser light output from a laser. The waveform 702 includes a plurality of coherence peaks 704 corresponding to different lasing modes. The plurality of coherence peaks 704 are each separated by 1 FSR. The controller 622 may be configured to apply a drive current/voltage to the phase shifter 606 that has a frequency that changes over time, also referred to as "chirping" the phase shifter 606. Such chirping causes the optical phase of the coherence peaks 704 to shift in proportion to the change in refractive index of the optical cavity 602 of the laser 600. For example, such chirping may cause each coherence peak to sweep back and forth across a region 706 that is 1 FSR. In some examples, the optical phase of the lasing modes of the lased light may be chirped using a sinusoidal waveform having a frequency that varies over time. In other examples, the optical phase of the lasing modes of the lased light may be chirped using a discrete (e.g., stepped) waveform having a frequency that varies over time. The controller 622 may modulate the refractive index of the phase shifter 606 to shift the phase of lasing modes of lased light to fill a spectrum of the lased light in any suitable manner. In one example, in a Gallium Nitride Fabry Perot laser diode, a refractive index change of ~0.01%, can result in a spectral shift as large as one free-spectral range (FSR) filling all the gaps in the spectrum of lased light. By chirping the phase shifter 606 fast enough (faster than one-pixel time of the MEMS laser scanning display 200 shown in FIG. 2), the optical phase is shifted such that the time averaged spectrum of the lased light may be perceived as having reduced coherence or may be perceived as being incoherent. As used herein, the term "light having reduced coherence" is used to describe a laser light spectrum that has reduced coherence as compared to a laser light spectrum emitted by a conventional laser diode emitter in which a refractive index is not modulated.

Figure 8:
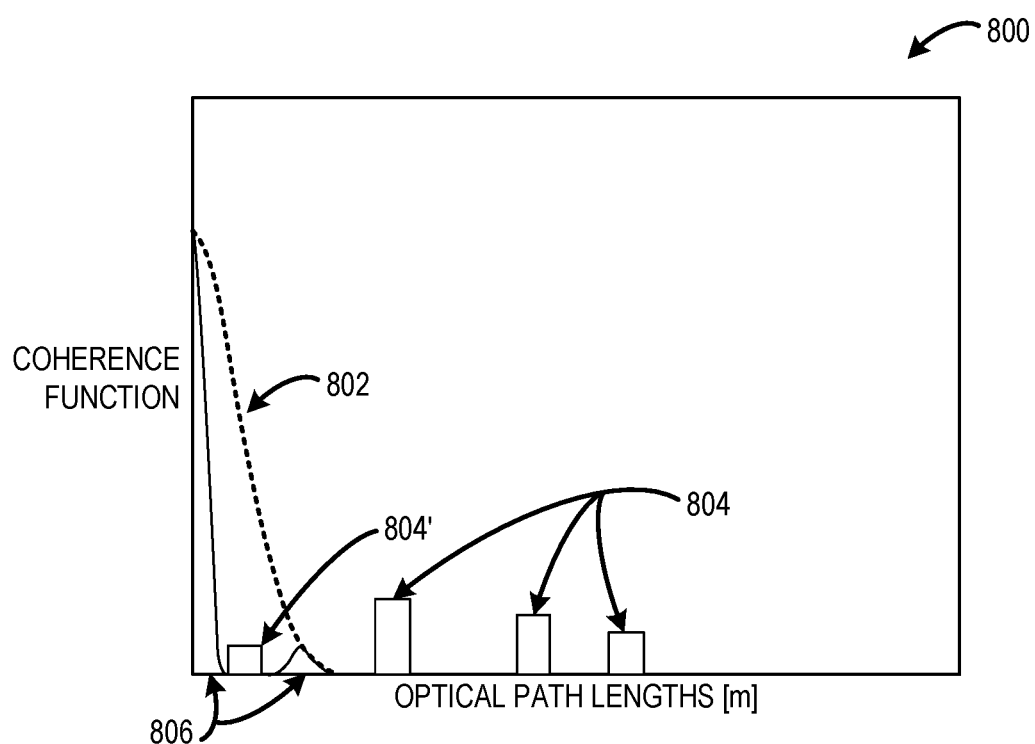
FIG. 8 shows a graph of an example coherence function corresponding to a waveform of lased light output from a laser based on a phase shifter is chirped.

FIG. 8 shows a graph 800 of an example coherence function 802 corresponding to a waveform of lased light output from the laser 600 when the phase shifter 606 is chirped to increase an exponential decay rate of the coherence function 802. In particular, the coherence function 802 is decayed such that overlap with a plurality of interference fringes 804 is reduced. In this example, an interference fringe 804' that is within an envelope of the coherence function 802 does not overlap with any of the coherence peaks 806 of the laser light and the remaining interference fringes 804 are outside of the envelope of the coherence function 802. In some examples, the coherence function may be decayed such that interference fringes of the waveguide may be avoided completely.

The exponential decay rate of the coherence function of the lased light output from the laser 600 may be increased in any suitable manner by chirping the phase shifter 606 in order to reduce fringe interference in the waveguide relative to what would occur absent chirping and/or other modulation of the refractive index of the phase shifter 606.

Figure 9:
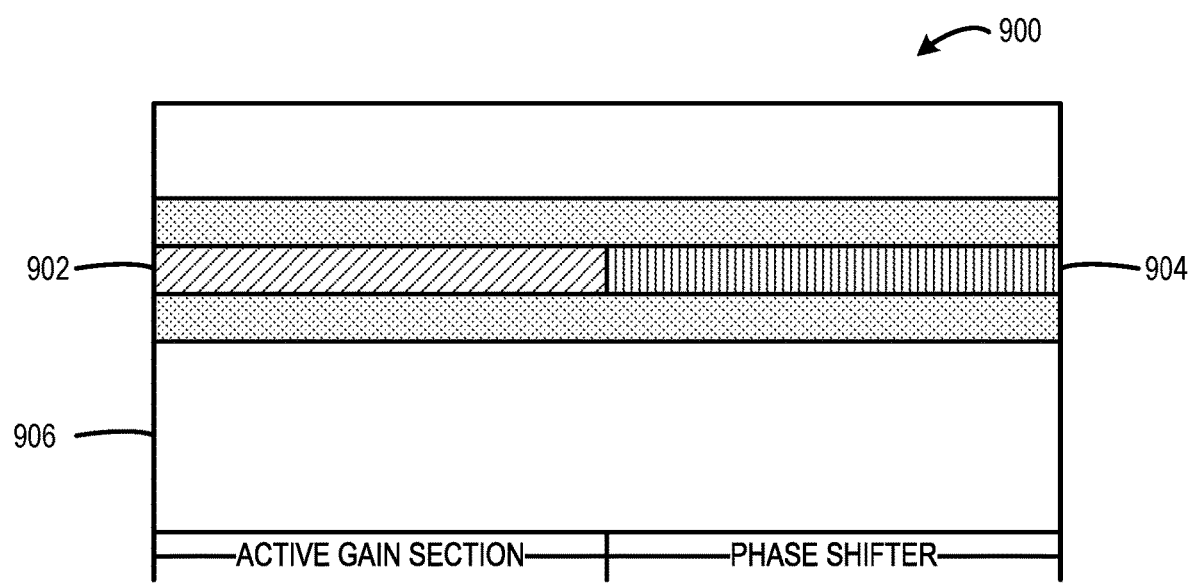
FIGS. 9-11 schematically show different example configurations of an active gain section and a phase shifter on a monolithic integration of an optical cavity of an edge-emitting laser.
Figure 10:
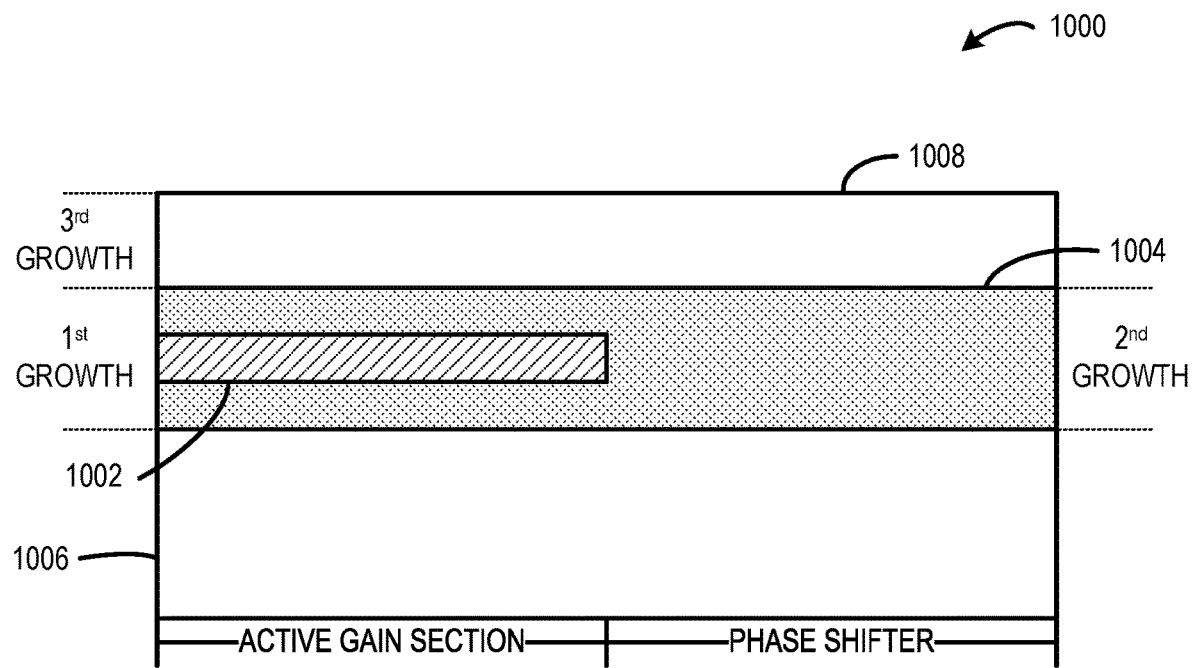
Figure 11:
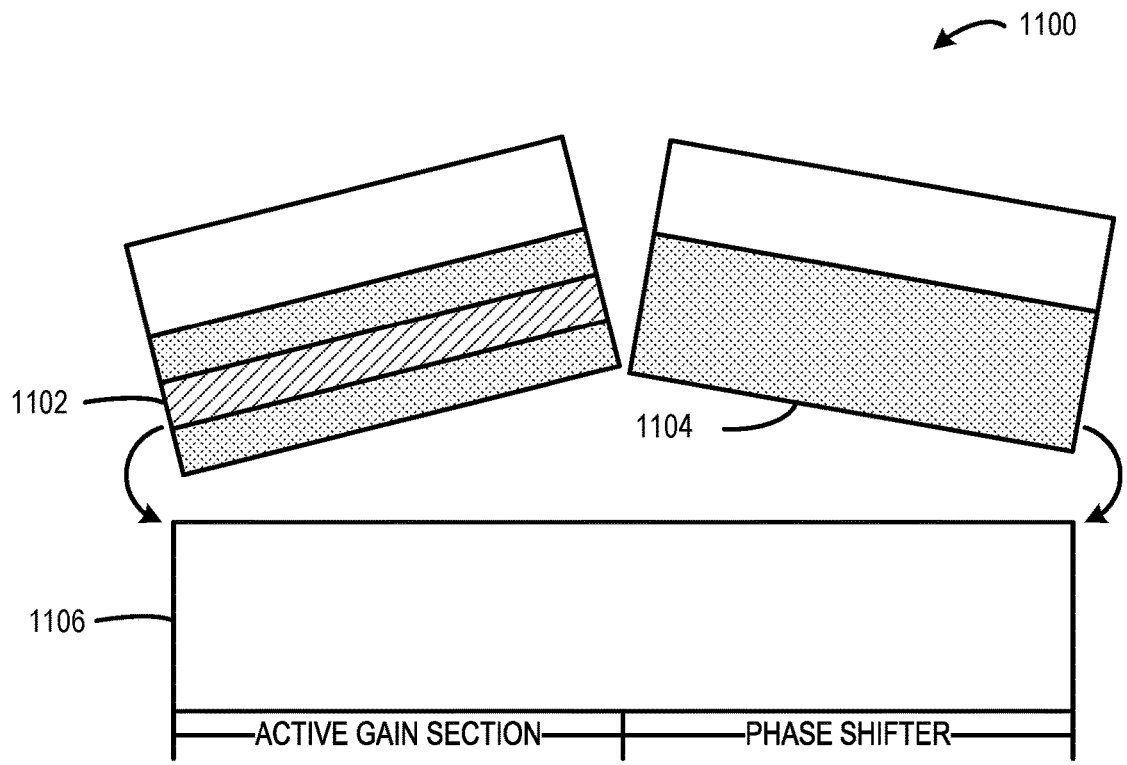

For efficient operation of a laser that includes an intra-cavity phase shifter, it may be desirable for the phase shifter to add minimal or no loss to the optical cavity of the laser. FIG. 9-11 show different methods for constructing a laser such that a loss contribution of the phase shifter may be minimized.

FIG. 9 schematically shows an example laser 900 including an active gain section 902 and a phase shifter 904. The active gain section 902 and the phase shifter 904 may be formed as the same epitaxial layers on a substrate 906. The phase shifter 904 may include a plurality of quantum wells that are capped with a material which generates vacancies in the semiconductor crystal of the quantum wells. These vacancies may be generated by implanting ions into the capping layer and diffusing the ions throughout the phase shifter 904 when the wafer is annealed at a low temperature. These vacancies cause the quantum well atomic species to intermix with the atomic species of the adjacent barrier layers that leads to an increase of the effective bandgap of the quantum wells, such that the phase shifter 904 becomes transparent. In some examples, since the phase shifter 904 is formed in the same epitaxial layers as the gain section, the phase shifter 904 may be direct current (DC) biased to a transparency regime to avoid loss and amplitude modulation.

In some examples, a laser including an intra-cavity phase shifter may be fabricated using a multi-step epitaxial process. FIG. 10 shows an example laser 1000 where an active gain section 1002 and a phase shifter 1004 are created in different growth steps. In a first growth step, the active gain section 1004 is grown on a substrate 1006. Next the active gain section 1002 is masked, and the exposed area is etched away. In a second selective area regrowth step, the etched-away area is replaced with a transparent waveguide stack to form the phase shifter 1004. In a third growth step, a substrate layer 1008 is grown on the phase shifter 1004. Such a multi-step growth process may provide a large flexibility in the epitaxial layer structure and in the doping levels of the laser 1000. In this case, the epitaxial layer including the phase shifter 1004 may have a larger bandgap than a bandgap of the epitaxial layer including the active gain section 1002.

FIG. 11 shows an example laser 1100 where each of an active gain section 1102 and a phase shifter 1104 is grown on separate wafers. Each wafer may be grown with an optimum epitaxial recipe for the particular section. Further, each of the active gain section 1102 and the phase shifter 1104 may be lifted off their separate substrates and placed onto a common carrier substrate 1106. The active gain section 1102 may be edge coupled with the phase shifter 1104 on the carrier substrate 1106. It will be appreciated that a laser may be made using any suitable fabrication technique.

Figure 12:
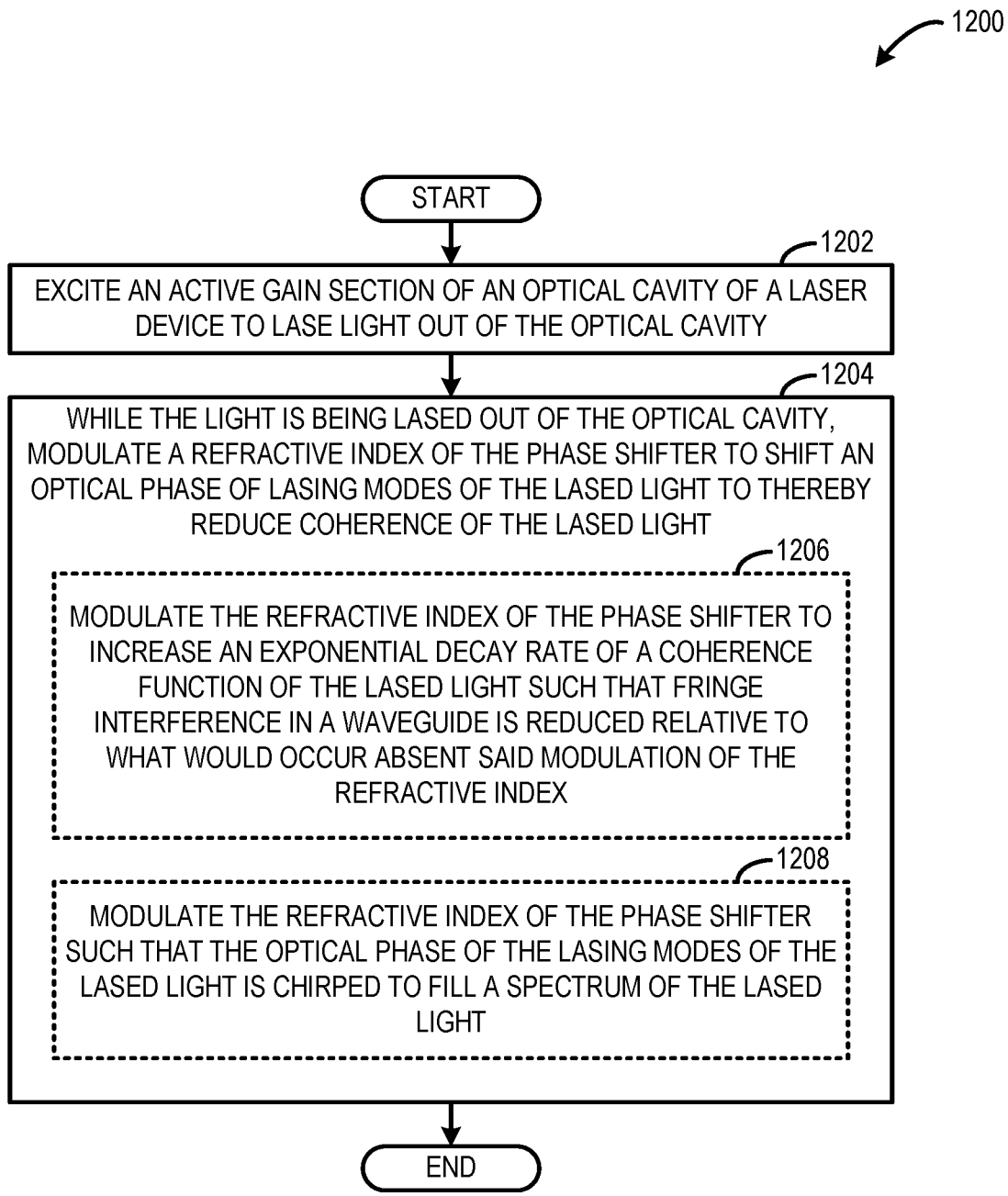
FIG. 12 is a flowchart of an example method for operating a laser device having an optical cavity including an active gain section and a phase shifter.

FIG. 12 shows an example method 1200 for operating a laser device including a laser having an optical cavity including an active gain section and a phase shifter. For example, the method 1200 may be performed by the controller 220 to operate any of the laser diode emitters 202 of the MEMS laser scanning display 200 shown in FIG. 2, the controller 622 to operate the laser 600 shown in FIG. 6, or generally any other suitable laser device.

At 1202, the method 1200 includes exciting an active gain section of the laser to lase light out of the optical cavity.

At 1204, the method 1200 includes while the light is being lased out of the optical cavity, modulating a refractive index of the phase shifter to shift an optical phase of lasing modes of the lased light to thereby reduce coherence of the lased light.

In some implementations where the lase is configured to lase light out of the optical cavity and into a waveguide, at 1206, the method 1200 may include modulating the refractive index of the phase shifter to increase an exponential decay rate of a coherence function of the lased light such that fringe interference in the waveguide is reduced relative to what would occur absent said modulation of the refractive index. In some implementations, the exponential decay rate of the coherence function of the lased light may be increased to avoid the interference fringes of the waveguide completely.

In some implementations, at 1208, the method 1200 may include modulating the refractive index of the phase shifter such that the optical phase of the lasing modes of the lased light is chirped to fill a spectrum of the lased light.

The herein-disclosed method may be performed to reduce a laser's coherence such that light lased out of the laser has a spectrum similar to that of an LED or other incoherent light source while preserving the advantageous characteristics of the laser, such as smaller size, lighter weight, lower power consumption, and higher brightness and contrast. Moreover, the method may be performed to reduce or eliminate interference fringes from images output from a waveguide-based display for which the laser acts as an illumination source. In this way, a display quality of images may be increased relative to other display that do not provide such fringe interference mitigation.

In some implementations, the methods and processes described herein may be tied to a computing system of one or more computing devices. In particular, such methods and processes may be implemented as a computer-application program or service, an application-programming interface (API), a library, and/or other computer-program product.

Figure 13:
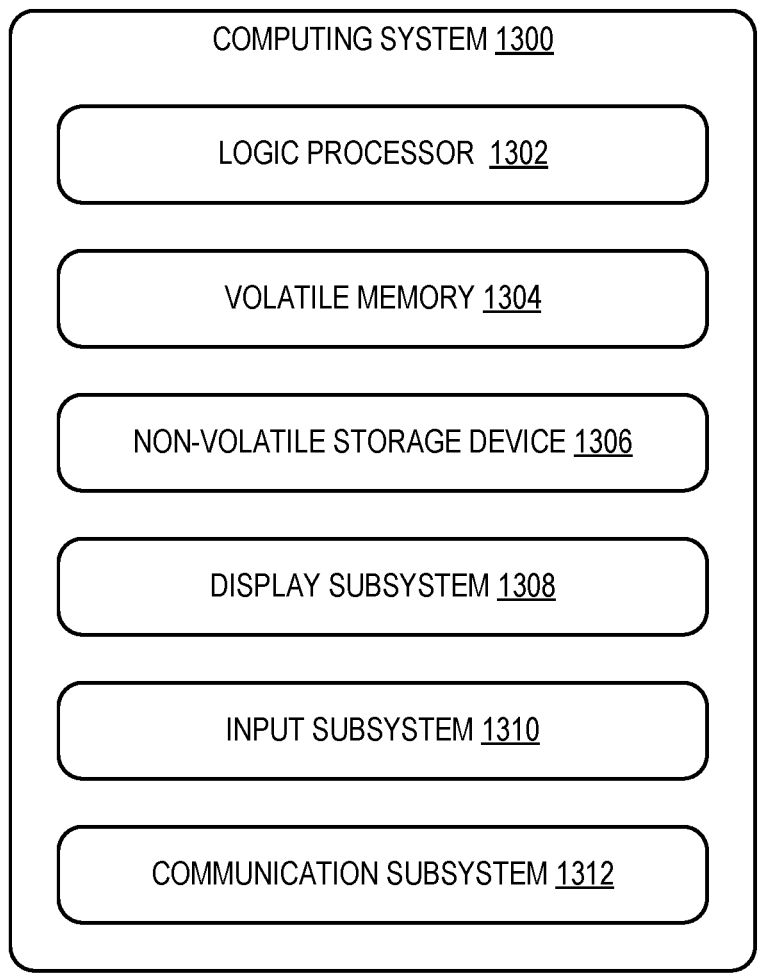
FIG. 13 schematically shows an example computing system.

FIG. 13 schematically shows a non-limiting implementation of a computing system 1300 that can enact one or more of the methods and processes described above. The computing system 1300 is shown in simplified form. For example, the computing system 1300 may embody the near-eye display system of FIG. 1, the MEMS laser scanning display 200 of FIG. 2, the controller 622, and/or any other suitable laser device described above. The computing system 1300 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

The computing system 1300 includes a logic processor 1302 volatile memory 1304, and a non-volatile storage device 1306. The computing system 1300 may optionally include a display subsystem 1308, input subsystem 1310, communication subsystem 1312, and/or other components not shown in FIG. 13.

Logic processor 1302 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 1302 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 1306 includes one or more physical devices configured to hold instructions executable by the logic processors to implement the methods and processes described herein. When such methods and processes are implemented, the state of non-volatile storage device 1306 may be transformed—e.g., to hold different data.

Non-volatile storage device 1306 may include physical devices that are removable and/or built in. Non-volatile storage device 1306 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 1306 may include nonvolatile, dynamic, static, read/write, read-only, sequential-access, location-addressable, file-addressable, and/or content-addressable devices. It will be appreciated that non-volatile storage device 1306 is configured to hold instructions even when power is cut to the non-volatile storage device 1306.

Volatile memory 1304 may include physical devices that include random access memory. Volatile memory 1304 is typically utilized by logic processor 1302 to temporarily store information during processing of software instructions. It will be appreciated that volatile memory 1304 typically does not continue to store instructions when power is cut to the volatile memory 1304.

Aspects of logic processor 1302, volatile memory 1304, and non-volatile storage device 1306 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 1308 may be used to present a visual representation of data held by non-volatile storage device 1306. The visual representation may take the form of a graphical user interface (GUI). As the herein described methods and processes change the data held by the non-volatile storage device, and thus transform the state of the non-volatile storage device, the state of display subsystem 1308 may likewise be transformed to visually represent changes in the underlying data. Display subsystem 1308 may include one or more display devices utilizing virtually any type of technology. Such display devices may be combined with logic processor 1302, volatile memory 1304, and/or non-volatile storage device 1306 in a shared enclosure, or such display devices may be peripheral display devices.

When included, input subsystem 1310 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 1312 may be configured to communicatively couple various computing devices described herein with each other, and with other devices. Communication subsystem 1312 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 1300 to send and/or receive messages to and/or from other devices via a network such as the Internet.

In an example, a laser device, comprises a laser having an optical cavity including an active gain section and a phase shifter; and a controller configured to 1) excite the active gain section to lase light out of the optical cavity and 2) while the light is being lased out of the optical cavity, modulate a refractive index of the phase shifter to shift an optical phase of lasing modes of the lased light to thereby reduce coherence of the lased light. In this example and/or other examples, the optical cavity may be configured to lase light into a waveguide, and the controller may be configured to modulate the refractive index of the phase shifter to increase an exponential decay rate of a coherence function of the lased light such that fringe interference in the waveguide is reduced relative to what would occur absent said modulation of the refractive index. In this example and/or other examples, the controller may be configured to modulate the refractive index of the phase shifter such that the optical phase of the lasing modes of the lased light is chirped to fill a spectrum of the lased light. In this example and/or other examples, the optical phase of the lasing modes of the lased light may be chirped using a sinusoidal waveform. In this example and/or other examples, the controller may be configured to modulate the refractive index of the phase shifter by applying an electrostatic field to the phase shifter. In this example and/or other examples, the controller may be configured to modulate the refractive index of the phase shifter by injecting carriers into the phase shifter. In this example and/or other examples, the controller may be configured to modulate the refractive index of the phase shifter by varying temperature at the phase shifter. In this example and/or other examples, the active gain section and the phase shifter may be formed as a same epitaxial layer, and the phase shifter maybe direct current (DC) biased to a transparency regime. In this example and/or other examples, the active gain section may be formed on a first epitaxial layer and the phase shifter may be formed on second epitaxial layer having a larger bandgap than a bandgap of the first epitaxial layer. In this example and/or other examples, the active gain section may include a plurality of active quantum wells, and the phase shifter may include a plurality of passive quantum wells made substantially transparent via ion implantation. In this example and/or other examples, the active gain section and the phase shifter are formed as separate epitaxial layers on different substrates, and the active gain section and the phase shifter are optically coupled to a common carrier substrate. In this example and/or other examples, the laser may comprise a Gallium Nitride Fabry Perot laser diode.

In another example, a method for operating a laser device having an optical cavity including an active gain section and a phase shifter, the method comprises exciting the active gain section to lase light out of the optical cavity, and while the light is being lased out of the optical cavity, modulating a refractive index of the phase shifter to shift an optical phase of lasing modes of the lased light to thereby reduce coherence of the lased light. In this example and/or other examples, the optical cavity may be configured to lase light into a waveguide, and the method may further comprise modulating the refractive index of the phase shifter to increase an exponential decay rate of a coherence function of the lased light such that fringe interference in the waveguide is reduced relative to what would occur absent said modulation of the refractive index. In this example and/or other examples, the method may further comprise modulating the refractive index of the phase shifter such that the optical phase of the lasing modes of the lased light is chirped to fill a spectrum of the lased light.

In yet another example, a near-eye display device comprises a waveguide configured to propagate coherent light towards a user's eye, and a laser configured to lase light out of the laser and into the waveguide, the laser including an optical cavity having an active gain section and a phase shifter, and a controller configured to 1) excite the active gain section to lase light out of the optical cavity and 2) while the light is being lased out of the optical cavity, modulate a refractive index of the phase shifter to shift an optical phase of lasing modes of the lased light to thereby reduce coherence of the lased light and increase an exponential decay rate of a coherence function of the lased light such that fringe interference in the waveguide is reduced relative to what would occur absent said modulation of the refractive index. In this example and/or other examples, the controller may be configured to modulate the refractive index of the phase shifter such that the optical phase of the lasing modes of the lased light is chirped to fill a spectrum of the lased light. In this example and/or other examples, the controller may be configured to modulate the refractive index of the phase shifter by applying an electrostatic field to the phase shifter. In this example and/or other examples, the controller may be configured to modulate the refractive index of the phase shifter by injecting carriers into the phase shifter. In this example and/or other examples, the controller may be configured to modulate the refractive index of the phase shifter by varying a temperature of the phase shifter.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A laser device, comprising:
   a laser having an optical cavity including an active gain section and a phase shifter;
   a waveguide configured to receive lased light emitted from the laser; and
   a controller configured to 1) excite the active gain section to lase light out of the optical cavity and 2) while the light is being lased out of the optical cavity, modulate a refractive index of the phase shifter to shift an optical phase of lasing modes of the lased light to thereby reduce coherence of the lased light and increase an exponential decay rate of a coherence function of the lased light high enough to mitigate fringe interference due to overlap between lasing modes of the lased light and waveguide-defined fringes of the waveguide.

2. The laser device of claim 1, wherein the controller is configured to modulate the refractive index of the phase shifter such that the optical phase of the lasing modes of the lased light is chirped to fill a spectrum of the lased light.

3. The laser device of claim 2, wherein the optical phase of the lasing modes of the lased light is chirped using a sinusoidal waveform.

4. The laser device of claim 1, wherein the controller is configured to modulate the refractive index of the phase shifter by applying an electrostatic field to the phase shifter.

5. The laser device of claim 1, wherein the controller is configured to modulate the refractive index of the phase shifter by injecting carriers into the phase shifter.

6. The laser device of claim 1, wherein the controller is configured to modulate the refractive index of the phase shifter by varying temperature at the phase shifter.

7. The laser device of claim 1, wherein the active gain section and the phase shifter are formed as a same epitaxial layer, and wherein the phase shifter is direct current (DC) biased to a transparency regime.

8. The laser device of claim 1, wherein the active gain section is formed on a first epitaxial layer and the phase shifter is formed on second epitaxial layer having a larger bandgap than a bandgap of the first epitaxial layer.

9. The laser device of claim 1, wherein the active gain section includes a plurality of active quantum wells, and wherein the phase shifter includes a plurality of passive quantum wells made substantially transparent via ion implantation.

10. The laser device of claim 1, wherein the active gain section and the phase shifter are formed as separate epitaxial layers on different substrates, and the active gain section and the phase shifter are optically coupled to a common carrier substrate.

11. The laser device of claim 1, wherein the laser comprises a Gallium Nitride Fabry Perot laser diode.

12. A method for operating a laser device having an optical cavity including an active gain section, a phase shifter, and a waveguide, the method comprising:
    exciting the active gain section to lase light out of the optical cavity;
    while the light is being lased out of the optical cavity, modulating a refractive index of the phase shifter to shift an optical phase of lasing modes of the lased light to thereby reduce coherence of the lased light and increase an exponential decay rate of a coherence function of the lased light high enough to mitigate fringe interference due to overlap between the lasing modes of the lased light and waveguide-defined fringes of the waveguide.

13. The method of claim 12, further comprising modulating the refractive index of the phase shifter such that the optical phase of the lasing modes of the lased light is chirped to fill a spectrum of the lased light.

14. A near-eye display device, comprising:
    a waveguide configured to propagate coherent light towards a user's eye; and
    a laser configured to lase light out of the laser and into the waveguide, the laser including an optical cavity having an active gain section and a phase shifter; and
    a controller configured to 1) excite the active gain section to lase light out of the optical cavity and 2) while the light is being lased out of the optical cavity, modulate a refractive index of the phase shifter to shift an optical phase of lasing modes of the lased light to thereby reduce coherence of the lased light and increase an exponential decay rate of a coherence function of the lased light high enough to mitigate fringe interference due to overlap between the lasing modes of the lased light and waveguide-defined fringes of the waveguide.

15. The near-eye display device of claim 14, wherein the controller is configured to modulate the refractive index of the phase shifter such that the optical phase of the lasing modes of the lased light is chirped to fill a spectrum of the lased light.

16. The near-eye display device of claim 14, wherein the controller is configured to modulate the refractive index of the phase shifter by applying an electrostatic field to the phase shifter.

17. The near-eye display device of claim 14, wherein the controller is configured to modulate the refractive index of the phase shifter by injecting carriers into the phase shifter.

18. The near-eye display device of claim 14, wherein the controller is configured to modulate the refractive index of the phase shifter by varying a temperature of the phase shifter.

* * * * *